(12) United States Patent
Xiong et al.

(10) Patent No.: US 11,503,710 B2
(45) Date of Patent: Nov. 15, 2022

(54) POWER MODULE

(71) Applicant: Delta Electronics, Inc., Taoyuan (TW)

(72) Inventors: Yahong Xiong, Taoyuan (TW); Da Jin, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 22 days.

(21) Appl. No.: 17/167,364

(22) Filed: Feb. 4, 2021

(65) Prior Publication Data

US 2021/0274656 A1 Sep. 2, 2021

(30) Foreign Application Priority Data

Feb. 27, 2020 (CN) .......................... 202010123504.8
Oct. 14, 2020 (CN) .......................... 202011096074.1

(51) Int. Cl.
*H05K 1/14* (2006.01)
*H05K 1/11* (2006.01)
(Continued)

(52) U.S. Cl.
CPC ........... *H05K 1/145* (2013.01); *H01F 27/266* (2013.01); *H01F 27/2804* (2013.01); *H01F 27/29* (2013.01); *H01F 27/34* (2013.01); *H05K 1/111* (2013.01); *H05K 1/144* (2013.01); *H05K 1/165* (2013.01); *H05K 1/181* (2013.01); *H05K 3/3494* (2013.01); *H05K 2201/086* (2013.01); *H05K 2201/10015* (2013.01); *H05K 2201/10053* (2013.01); *H05K 2201/10189* (2013.01); *H05K 2201/10734* (2013.01)

(58) Field of Classification Search
CPC ....................................................... H05K 1/114
USPC .......................................................... 361/760
See application file for complete search history.

(56) References Cited

U.S. PATENT DOCUMENTS 7,187,263 B2 3/2007 Vinciarelli
8,531,841 B2 9/2013 Lee
(Continued)

FOREIGN PATENT DOCUMENTS

CN 101017730 A 8/2007
CN 102360808 B 7/2014
(Continued)

*Primary Examiner* — Stanley Tso
(74) *Attorney, Agent, or Firm* — Kirton McConkie; Evan R. Witt (57) ABSTRACT

The present disclosure is related to a power module includes a first printed circuit board (PCB), a second PCB, a magnetic component and a connecting component. A secondary side switch set and a winding are disposed on the first PCB, respectively. A primary side switch set is disposed on the second PCB adjacent to the first PCB. A magnetic component includes an upper magnetic cover disposed on the first side of the first PCB; a lower magnetic cover disposed between the first PCB and the second PCB; and a lateral column located between the two magnetic covers. The lateral column passes through the first PCB, and is fastened with the two magnetic covers. The magnetic component and the winding collaboratively form a transformer. The connecting component is disposed between the two PCBs to connect the corresponding potential points of the two PCBs.

20 Claims, 9 Drawing Sheets

(51) Int. Cl.
*H05K 1/16* (2006.01)
*H01F 27/26* (2006.01)
*H01F 27/28* (2006.01)
*H01F 27/29* (2006.01)
*H01F 27/34* (2006.01)
*H05K 1/18* (2006.01)
*H05K 3/34* (2006.01)

(56) References Cited

U.S. PATENT DOCUMENTS

| | | |
|---|---|---|
| 9,387,633 B1 | 7/2016 | Vinciarelli et al. |
| 9,729,059 B1 | 8/2017 | Parto |
| 10,062,499 B2 | 8/2018 | Ji et al. |
| 11,201,560 B2 | 12/2021 | Sakata |
| 2003/0174037 A1 | 9/2003 | Hooey et al. |
| 2005/0083665 A1 | 4/2005 | Nakashima et al. |
| 2007/0152795 A1 | 7/2007 | Zeng et al. |
| 2009/0085702 A1 | 4/2009 | Zeng et al. |
| 2010/0164670 A1* | 7/2010 | Nakahori ............... H05K 1/165 336/200 |
| 2015/0282370 A1 | 10/2015 | Yang et al. |
| 2020/0113058 A1 | 4/2020 | Xiong et al. |
| 2020/0113059 A1 | 4/2020 | Xiong et al. |

FOREIGN PATENT DOCUMENTS

| | | |
|---|---|---|
| CN | 104205258 A | 12/2014 |
| CN | 103460309 B | 8/2016 |
| CN | 107077951 B | 5/2019 |
| CN | 111092536 A | 5/2020 |
| JP | 5998774 B2 | 9/2016 |

\* cited by examiner

POWER MODULE

CROSS-REFERENCE TO RELATED APPLICATION

This application claims priority to China Patent Application No. 202010123504.8, filed on Feb. 27, 2020. This application also claims priority to China Patent Application No. 202011096074.1, filed on Oct. 14, 2020. The entire contents of the above-mentioned patent applications are incorporated herein by reference for all purposes.

FIELD OF THE INVENTION

The present disclosure relates to a power module, and more particularly to a power module with lower cost, smaller volume and higher power density.

BACKGROUND OF THE INVENTION

With the rapid development of science and technology today, power modules are widely used in different fields, such as telephone communications, data centers, and supercomputers. In these fields, power modules are used to convert received electric energy into a regulated voltage in order to power the related electronic devices. Generally, the power module is equipped with a converter circuit to convert electric energy. However, in order to meet the requirement of greater output power, the power module is actually equipped with multiple converter circuits connected in parallel to each other to increase the output power of the power module.

The single-phase converter circuit of the power module includes two primary windings, two secondary windings, two primary switches, two secondary switches and a magnetic component. In order to meet the requirements of greater output power, the power module needs to include two-phase or more than two-phase converter circuits. Therefore, the power module must include at least four primary windings, four secondary windings, four primary switches, four secondary switches and two magnetic components. However, the power module includes at least two magnetic components disposed therein, and it increases the fabricating cost of the power module. Moreover, since the conversion circuits with two-phase or more than two-phase need a plurality of magnetic components to electromagnetically couple the primary windings and the secondary windings, the volume of the power module is large and detrimental to miniaturization. Furthermore, more space on the system board is occupied by the plurality of magnetic components, and the power density of the power module is reduced.

Therefore, there is a need to provide a power module with lower cost, smaller volume and higher power density to address the above issues encountered by the prior arts.

SUMMARY OF THE INVENTION

An object of the present disclosure provides a power module with lower cost, smaller volume and higher power density. With a single magnetic component, a primary winding and a secondary winding corresponding to a first phase converter circuit are coupled with each other, and a primary winding and a secondary winding corresponding to a second phase converter circuit are coupled with each other. The four primary windings and the four secondary windings form two magnetic integrated transformers with magnetic integration technology, respectively, so that a structure of two-phase converter circuit sharing the single magnetic component is achieved. It is helpful of reducing the size and the cost of the transformer at the same time. The reduced size of the transformer also means that the space occupied by the transformer on the first printed circuit board is smaller, so that more space on the first printed circuit board is provided for more components, and the power density of the power module is increased. In addition, the present disclosure further disposes the primary switches on a second printed circuit board. Therefore, more space on the first printed circuit board is provided to dispose the primary windings and secondary windings, and the trace width for the primary windings and the secondary windings are widen, so that the loss in the transformer are decreased and the power density of the power module is increased.

In accordance with an aspect of the present disclosure, a power module is provided. The power module includes a first printed circuit board, a second printed circuit board, a magnetic component and a connecting component. The first printed circuit board includes a first side and a second side. A secondary side switch set is disposed on the first side or the second side of the first printed circuit board, and a winding is disposed on the first printed circuit board. The second printed circuit board includes a first side and a second side, the first side of the second printed circuit board is adjacent to the second side of the first printed circuit board. A primary side switch set is disposed on the first side of the second printed circuit board. The magnetic component includes an upper magnetic cover, a lower magnetic cover and a lateral column. The lateral column is located between the upper magnetic cover and the lower magnetic cover. The lower magnetic cover is disposed between the first printed circuit board and the second printed circuit board. The upper magnetic cover is disposed on the first side of the first printed circuit board. The lateral column penetrates the first printed circuit board and is fastened with the upper magnetic cover and the lower magnetic cover. The magnetic component and the winding collaboratively form a transformer. The connecting component is disposed between the first printed circuit board and the second printed circuit board so as to achieve a corresponding connection of a potential point of the first printed circuit board and a potential point of the second printed circuit board.

DETAILED DESCRIPTION OF THE PREFERRED EMBODIMENT

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
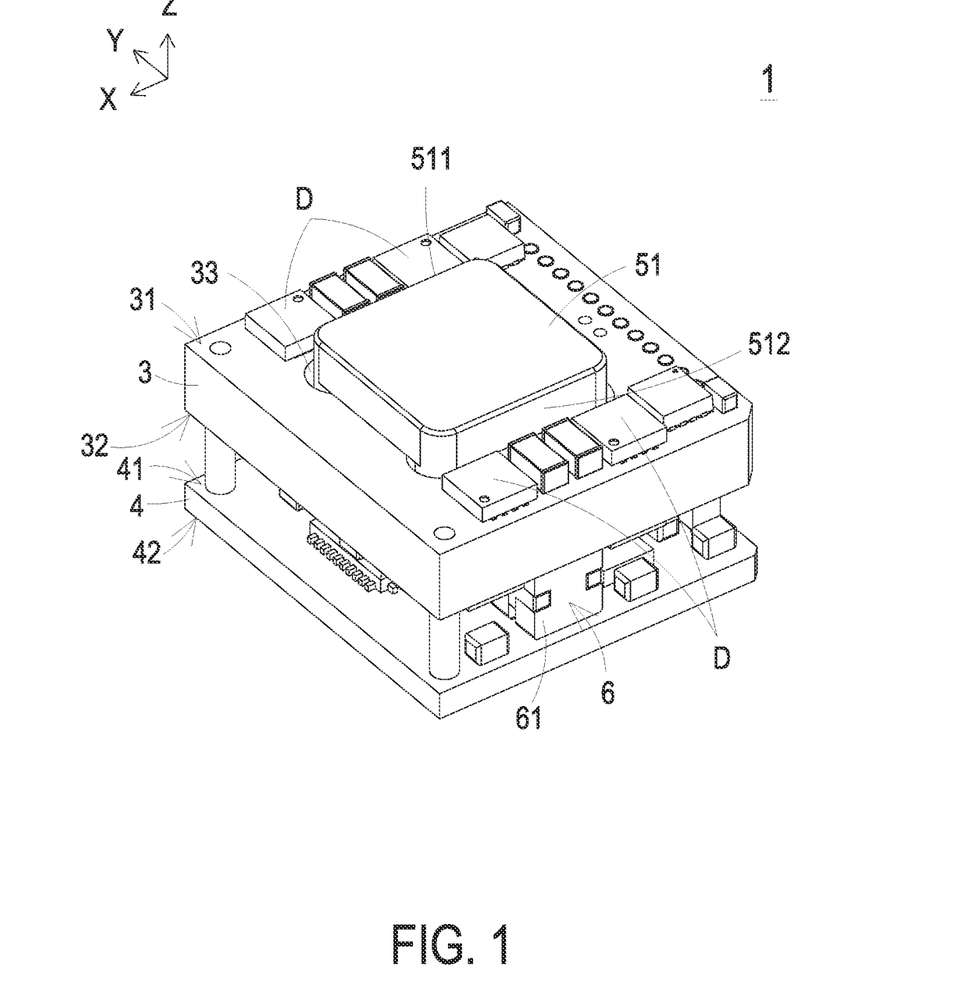
FIG. 1 is a schematic diagram of the power module according to an embodiment of the present disclosure.
Figure 2:
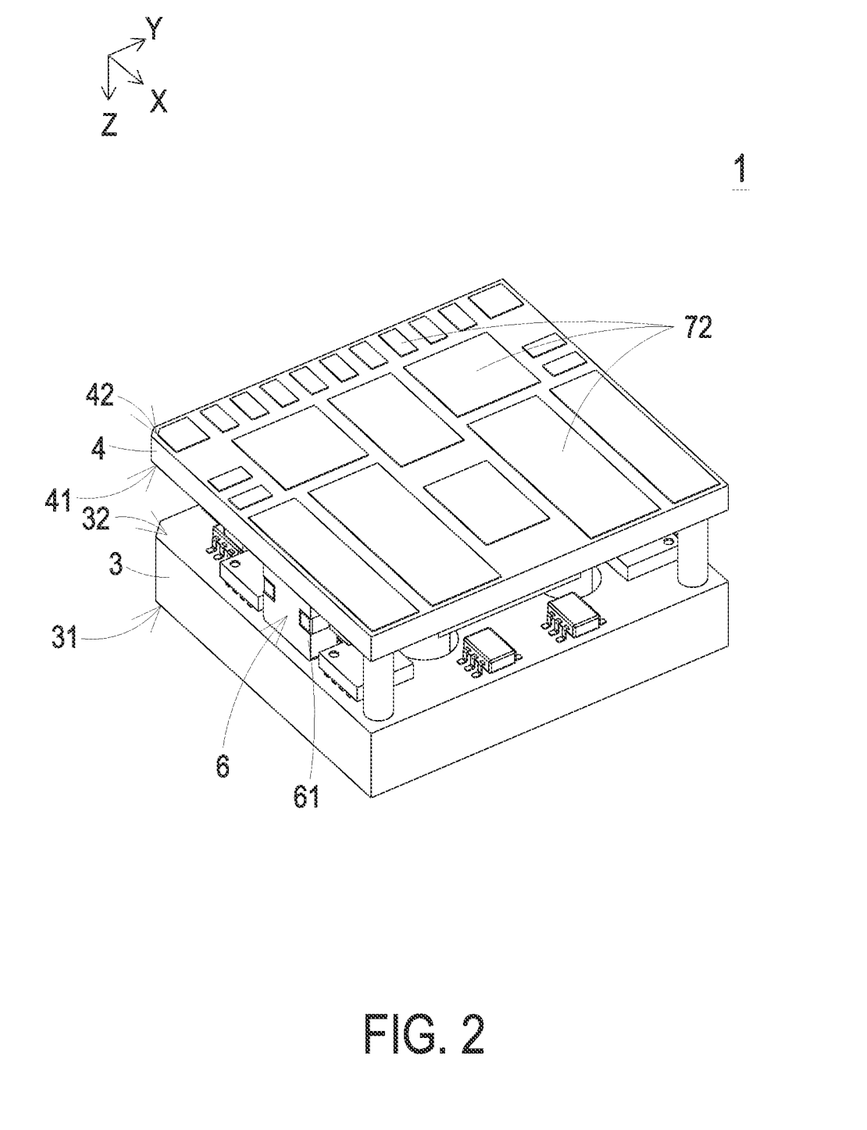
FIG. 2 is a schematic diagram of the power module shown in FIG. 1 and taken from another perspective.
Figure 3:
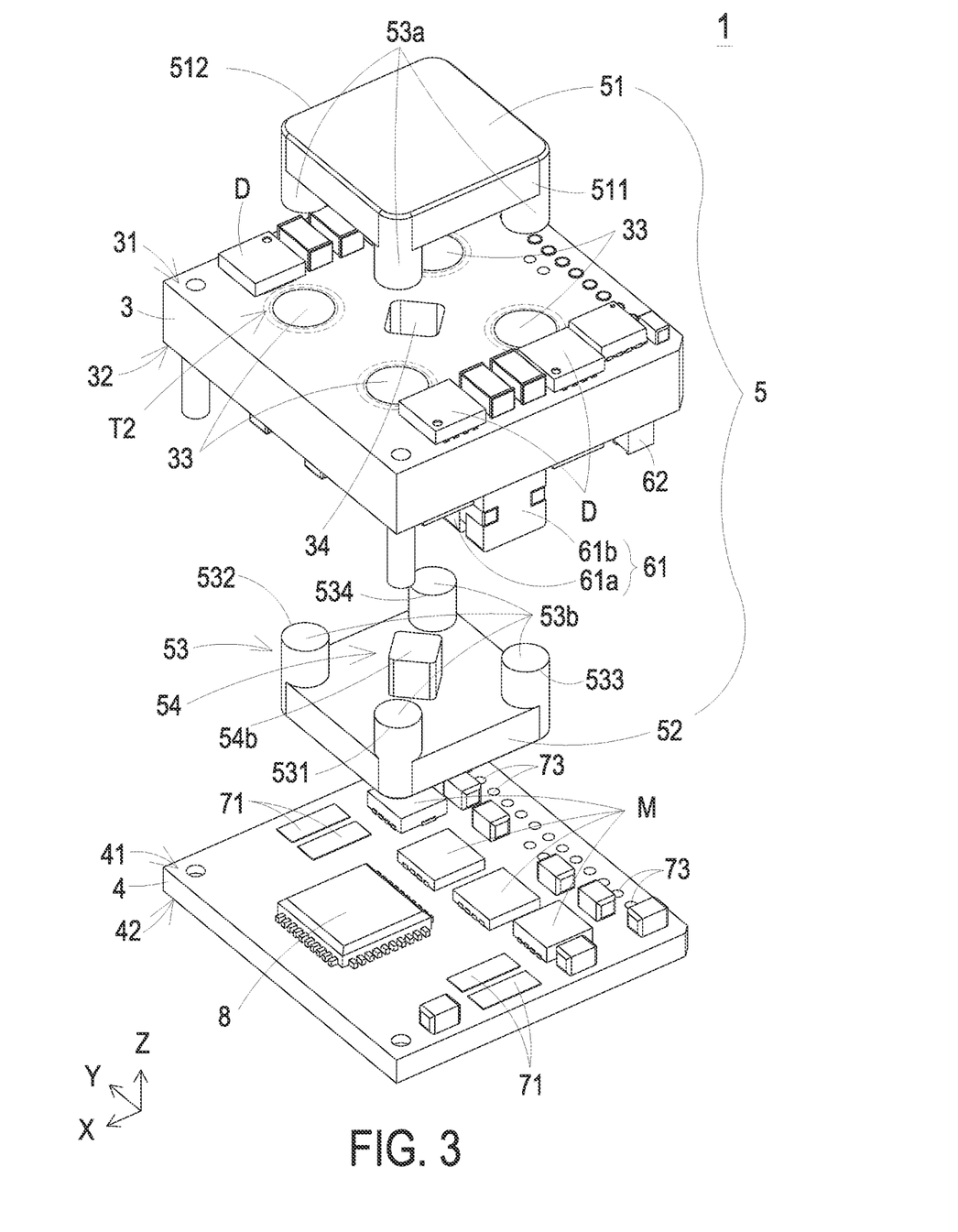
FIG. 3 is an exploded view of the power module shown in FIG. 1.
Figure 4:
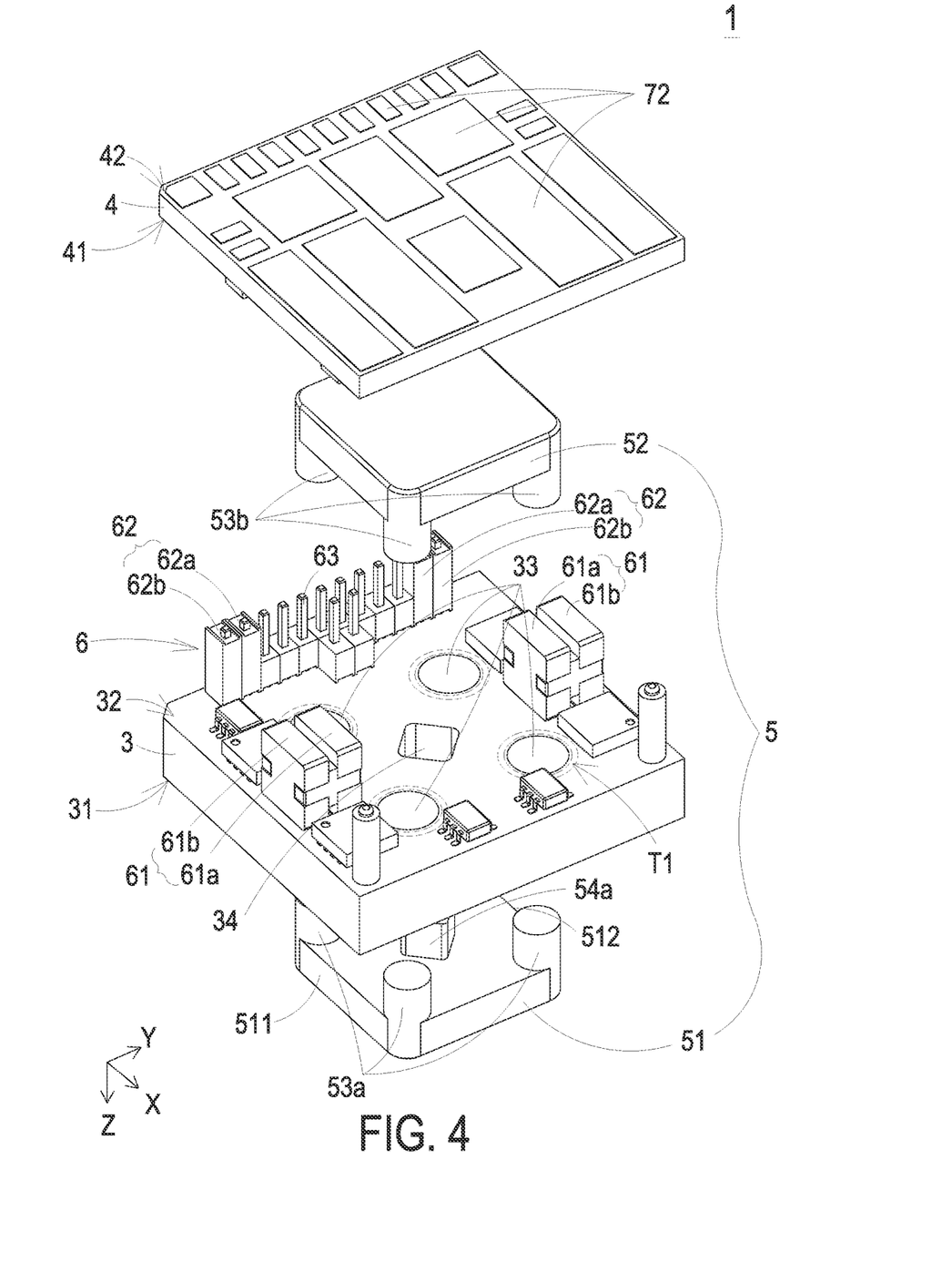
FIG. 4 is an exploded view of the power module shown in FIG. 1 and taken from another perspective.
Figure 6:
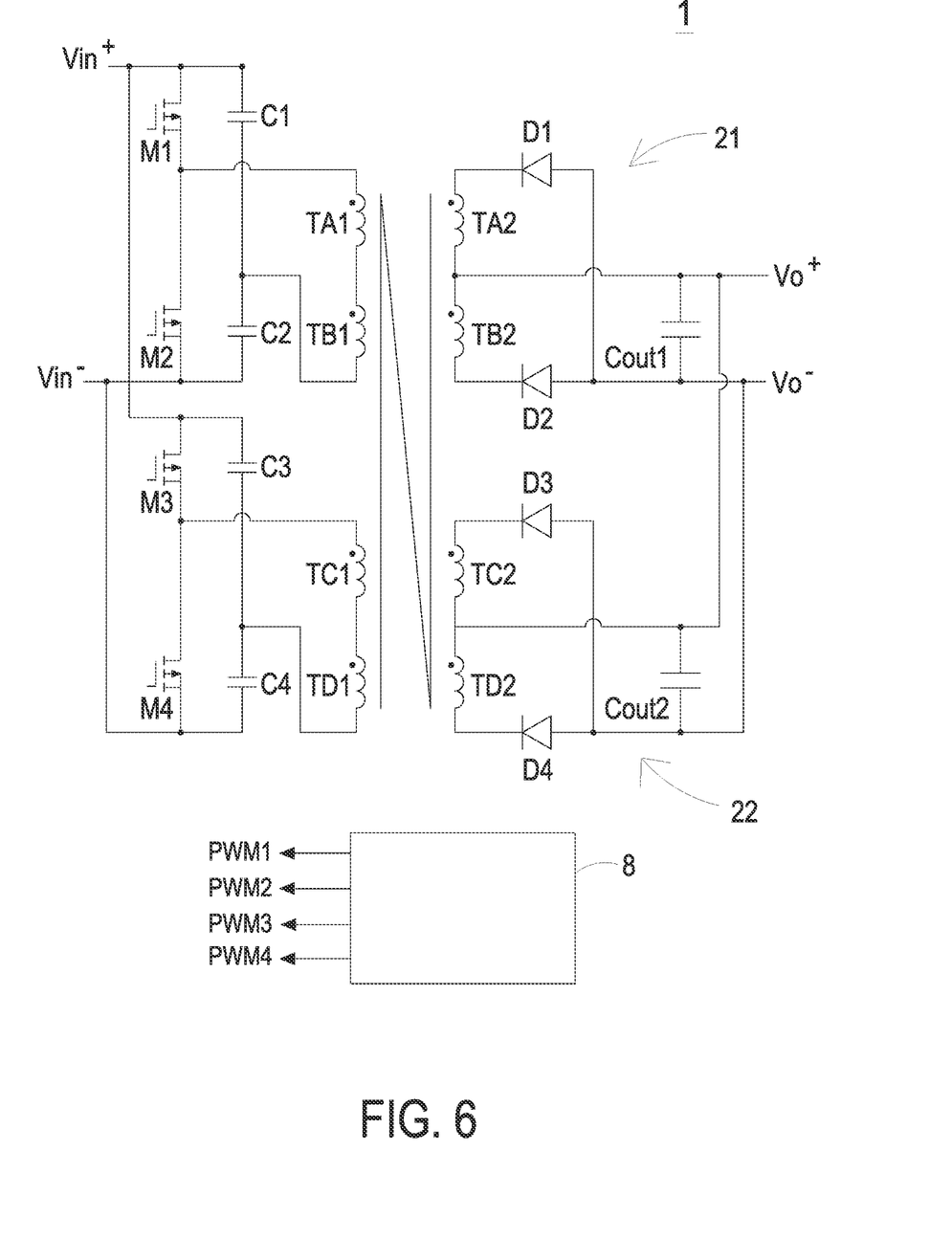
FIG. 6 is an equivalent circuit diagram of the power module according to the embodiment of the present disclosure shown in FIG. 1.

Refer to FIGS. 1 to 4 and FIG. 6. FIG. 1 is a schematic diagram of the power module according to an embodiment of the present disclosure. FIG. 2 is a schematic diagram of the power module shown in FIG. 1 and taken from another perspective. FIG. 3 is an exploded view of the power module shown in FIG. 1. FIG. 4 is an exploded view of the power module shown in FIG. 1 and taken from another perspective. FIG. 6 is an equivalent circuit diagram of the power module according to the embodiment of the present disclosure shown in FIG. 1. As shown in the figures, in the embodiment, the power module 1 is applied to an electronic device and connected to the system board (not shown) of the electronic device by welding. The power module 1 includes two-phase converter circuits connected in parallel with each other. Preferably but not exclusively, the power module 1 includes a first phase converter circuit 21 and a second phase converter circuit 22 shown in FIG. 6.

In the embodiment, the power module 1 includes a first printed circuit board 3, a second printed circuit board 4, a magnetic component 5 and a connecting component 6, stacked along the Z axis. The projections of the first printed circuit board 3 and the second printed circuit board 4 on the XY plane are overlapped to each other. The first printed circuit board 3 includes a first side 31 and a second side 32. In the embodiment, a secondary side switch set is disposed on the first side 31 or the second side 32 of the first printed circuit board 3, and a winding is disposed on the first printed circuit board 3. The second printed circuit board 4 includes a first side 41 and a second side 42, and the first side 41 of the second printed circuit board 4 is adjacent to the second side 32 of the first printed circuit board 3. In the embodiment, a primary side switch set is disposed on the first side 41 of the second printed circuit board 4. The magnetic component 5 includes an upper magnetic cover 51, a lower magnetic cover 52 and a lateral column 53. The lateral column 53 is located between the upper magnetic cover 51 and the lower magnetic cover 52, the lower magnetic cover 52 is disposed between the first printed circuit board 3 and the second printed circuit board 4, the upper magnetic cover 51 is disposed on the first side 31 of the first printed circuit board 3, and the lateral column 53 penetrates the first printed circuit board 3 and is fastened with the upper magnetic cover 51 and the lower magnetic cover 52. The magnetic component 5 is assembled with the winding to form a transformer. The connecting component 6 is disposed between the first printed circuit board 3 and the second printed circuit board 4, so as to achieve a corresponding connection of a potential point of the first printed circuit board 3 and a potential point of the second printed circuit board 4.

In terms of circuit structure, the first phase converter circuit 21 includes a first primary winding TA1, a second primary winding TB1, a first primary switch M1, a second primary switch M2, a first secondary winding TA2, a second secondary winding TB2, a first secondary switch D1, a second secondary switch D2, two input capacitors C1 and C2, and an output capacitor Cout1. The first primary winding TA1 and the second primary winding TB1 are electrically connected in series and form a first primary winding series branch. A second end of the first primary winding TA1 is electrically connected to a first end of the second primary winding TB1. One end of the first primary winding series branch is formed by a first end of the first primary winding TA1, and another end of the first primary winding series branch is formed by a second end of the second primary winding TB1. The first primary switch M1 and the second primary switch M2 are electrically connected in series and form the first primary switch bridge arm. A second end of the first primary switch M1 and a first end of the second primary switch M2 are electrically connected and form a midpoint of the first primary switch bridge arm. The input capacitors C1 and C2 are electrically connected and form a first capacitor bridge arm. A second end of the input capacitor C1 and a first end of the input capacitor C2 are electrically connected and form a midpoint of the first capacitor bridge arm. A first end of the input capacitor C1 is electrically connected to a first end of the first primary switch M1, and a second end of the input capacitor C2 is electrically connected to a second end of the second primary switch M2. One end of the first primary winding series branch is electrically connected to the midpoint of the first primary switch bridge arm, and another end of the first primary winding series branch is electrically connected to the midpoint of the first capacitor bridge arm. The first primary winding TA1, the second primary winding TB1, the first primary switch M1, the second primary switch M2 and the two input capacitors C1 and C2 form the primary side of the first phase converter circuit 21. The first end of the first secondary winding TA2 is electrically connected to a cathode of the first secondary switch D1, the second end of the first secondary winding TA2 is electrically connected to the first end of the second secondary winding TB2, and the second end of the second secondary winding TB2 is electrically connected to a cathode of the second secondary switch D2. The first secondary winding TA2, the second secondary winding TB2, the first secondary switch D1 and the second secondary switch D2 form the secondary side of the first phase converter circuit 21, and further form a center tap rectifier circuit. One end of the output capacitor Cout1 is electrically connected between the first secondary winding TA2 and the second secondary winding TB2, and another end of the output capacitor Cout1 is electrically connected between the anode of the first secondary switch D1 and the cathode of the second secondary switch D2. The first primary winding TA1 and the first secondary winding TA2 are coupled to each other. The second primary winding TB1 and the second secondary winding TB2 are coupled to each other. The first primary winding TA1 and the first secondary winding TA2 are wound on the same lateral column 53, and the second primary winding TB1 and the second secondary winding TB2 are wound on another lateral column 53.

The second phase converter circuit 22 includes a third primary winding TC1, a fourth primary winding TD1, a third primary switch M3, a fourth primary switch M4, a third secondary winding TC2, a fourth secondary winding TD2, a third secondary witch D3, a fourth secondary witch D4, two input capacitor C3 and C4, and an output capacitor Cout2. The third primary winding TC1 and the fourth primary winding TD1 are electrically connected and form a second primary winding series branch, and a second end of the third primary winding TC1 is electrically connected to a first end of the fourth primary winding TD1. One end of the second primary winding series branch is formed by a first end of the third primary winding TC1, and another end of the second primary winding series branch is formed by a second end of the fourth primary winding TD1. The third primary switch M3 and the fourth primary switch M4 are electrically connected in series and form a second primary switch bridge arm. A second end of the third primary switch M3 and a first end of the fourth primary switch M4 are electrically connected and form a midpoint of the second primary switch bridge arm. The input capacitors C3 and C4 are electrically connected and form a second capacitor bridge arm. A second end of the input capacitor C3 and a first end of the input capacitor C4 are electrically connected and form a midpoint of the second capacitor bridge arm. A first end of the input capacitor C3 is electrically connected to a first end of the third primary switch M3, and the second end of the input capacitor C4 is electrically connected to a second end of the fourth primary switch M4. One end of the second primary winding series branch is electrically connected to the midpoint of the second primary switch bridge arm, and another end of the second primary winding series branch is electrically connected to the midpoint of the second capacitor bridge arm. The third primary winding TC1, the fourth primary winding TD1, the third primary switch M3, the fourth primary switch M4 and the two input capacitors C3 and C4 form the primary side of the second phase converter circuit 22. A first end of the third secondary winding TC2 is electrically connected to a cathode of the third secondary switch D3, a second end of the third secondary winding TC2 is electrically connected to the first end of the fourth secondary winding TD2, and the second end of the fourth secondary winding TD2 is electrically connected to a cathode of the fourth secondary switch D4. The third secondary winding TC2, the fourth secondary winding TD2, the third secondary switch D3 and the fourth secondary switch D4 form the secondary side of the second phase converter circuit 22, and further form a center tap rectifier circuit. One end of the output capacitor Cout2 is electrically connected between the third secondary winding TC2 and the fourth secondary winding TD2, and another end of the output capacitor Cout2 is electrically connected between an anode of the third secondary switch D3 and an anode of the fourth secondary switch D4. The third primary winding TC1 and the third secondary winding TC2 are coupled to each other. The fourth primary winding TD1 and the fourth secondary winding TD2 are coupled to each other. The third primary winding TC1 and the third secondary winding TC2 are wound on the same lateral column 53, and the fourth primary winding TD1 and the fourth secondary winding TD2 are wound on another lateral column 53.

In the embodiment, a first terminal of the first phase converter circuit 21 and a first terminal of the second phase converter circuit 22 are electrically connected in parallel, so as to form an input terminal (including a positive input terminal Vin$^+$ and a negative input terminal Vin$^-$) of the power module 1. A second terminal of the first phase converter circuit 21 and a second terminal of the second phase converter circuit 22 are electrically connected in parallel, so as to form an output terminal (including a positive output terminal Vo$^+$ and a negative output terminal Vo$^-$) of power module 1. The output capacitor Cout1 of the first phase converter circuit 21 is electrically connected between the positive output terminal Vo$^+$ and the negative output terminal Vo$^-$, and the output capacitor Cout2 of the second phase converter circuit 22 is electrically connected between the positive output terminal Vo$^+$ and the negative output terminal Vo$^-$.

In terms of actual structure, as shown in FIGS. 1 to 4, the power module 1 includes four primary windings T1, four secondary windings T2, a first printed circuit board 3, a second printed circuit board 4, a magnetic component 5, four primary switches M, four secondary switches D and a connecting component 6. The four primary switches M, for example, are the first primary switch M1, the second primary switch M2, the third primary switch M3 and the fourth primary switch M4 shown in FIG. 6, and collectively referred to as primary side switches. The four secondary switches D, for example, are the first secondary switch D1, the second secondary switch D2, the third secondary switch D3 and the fourth secondary switch D4 shown in FIG. 6, and collectively referred to as secondary side switches. The first printed circuit board 3 includes a first side 31 and a second side 32. The second printed circuit board 4 includes a first side 41 and a second side 42. The first side 41 of the second printed circuit board 4 is adjacent to the second side 32 of the first printed circuit board 3, and the second side 42 of the second printed circuit board 4 is disposed on the system board of the electronic device. The connecting component 6 is connected to the first printed circuit board 3 and the second printed circuit board 4, respectively. The connecting component 6 is disposed between the first printed circuit board 3 and the second printed circuit board 4. In the embodiment, the four primary windings T1 are disposed adjacent to the second side 32 of the first printed circuit board 3, and the four secondary windings T2 are adjacent to the first side 31 of the first printed circuit board 3. The magnetic component 5 includes an upper magnetic cover 51, a lower magnetic cover 52, four lateral columns 53 and a middle column 54. Each of the lateral columns 53 are wound with a primary winding T1 and a secondary winding T2. The upper magnetic cover 51 is disposed on the first printed circuit board 3 from the first side 31 of the first printed circuit board 3. The lower magnetic cover 52 is disposed on the first printed circuit board 3 from the second side 32 of the first printed circuit board 3. The four lateral columns 53 and the middle column 54 penetrate the first printed circuit board 3 through four first through holes 33 and a second through hole 34, respectively, to fasten the upper magnetic cover 51 and the lower magnetic cover 52 to each other. The magnetic component 5 is magnetically coupled with the four primary windings and the four secondary windings, to form four transformers. The directions of the DC magnetic fluxes flowing through the four lateral columns 53 are the same, and the directions of the AC magnetic fluxes flowing through any adjacent two of the four lateral columns 53 have a staggered phase angle to reduce the loss of the power module 1 on the magnetic component 5 and improve the conversion efficiency of power module 1. The specific phase angle is adjustable according to the practical requirements.

With the wiring of the first printed circuit board 3 or the embedded copper column, the primary winding T1 and the secondary winding T2 described in the embodiments above are achieved. Preferably but not exclusively, the material of the upper magnetic cover 51, the lower magnetic cover 52 and the lateral columns 53 is formed by a ferrite material or an iron powder material, and the material of the middle column 54 is formed by a ferrite material with a segmented air gap or an iron powder material with a distributed air gap.

The four primary switches M are for example but not limited to MOSFETs, silicon carbide (SiC) switches, gallium nitride (GaN) switches, synchronous rectification switches or Schottky diodes. By welding or pasting conductive adhesive, the four primary switches M are disposed on the first side 41 of the second printed circuit board 4. The four secondary switches D are for example but not limited to MOSFETs, silicon carbide (SiC) switches, gallium nitride (GaN) switches, synchronous rectification switches or Schottky diodes. By welding or pasting conductive adhesive, the four secondary switches D are disposed on the first side 31 of the first printed circuit board 3 as shown in FIGS. 1 to 4. Two of the four primary windings T1, two of the four secondary windings T2, two of the four primary switches M, two of the four secondary switches D and the magnetic component 5 form the first phase converter circuit 21. The other two of the four primary windings T1, the other two of the four secondary windings T2, the other two of the four primary switches M, the other two of the four secondary switches D and the magnetic component 5 form the second phase converter circuit 22. As the result, the four primary windings T1, the four secondary windings T2, the four primary switches M, the four secondary switches D and the magnetic component 5 form the first phase converter circuit 21 and the second phase converter circuit 22 connected in parallel.

In the embodiment, the first phase converter circuit 21 and the second phase converter circuit 22 connected in parallel only share the single magnetic component 5, and the lower magnetic cover 52 is disposed between the first printed circuit board 3 and the second printed circuit board 4. Therefore, the cost of the power module 1 of the present disclosure is lower. Furthermore, with the single magnetic component 5, the primary winding T1 and the secondary winding T2 of the first phase converter circuit 21 are coupled to each other, and the primary winding T1 and the secondary winding T2 of the second phase converter circuit 22 are also coupled to each other simultaneously. The four primary windings T1 and the four secondary windings T2 of the power module 1 of the present disclosure form two magnetic integrated transformers with magnetic integration technology, respectively, and the volume of the transformers is relatively reduced. Since the space occupied by the transformers on the first printed circuit board 3 is reduced, more components may be disposed on the first printed circuit board 3 and the power density of the power module 1 is increased. In the present disclosure, the primary switches M are disposed on the second printed circuit board 4. Therefore, more space on the first printed circuit board 3 is provided to dispose other primary windings T1 and secondary windings t2, and the trace width for the primary windings T1 and the secondary windings T2 are widen, so that the loss in the transformer are decreased and the power density of the power module 1 is increased.

Please refer to FIGS. 1 to 4. In the embodiment, the magnetic component 5 includes the upper magnetic cover 51, the lower magnetic cover 52 and the four lateral columns 53. Each of the lateral columns 53 includes an upper lateral column 53a and a lower lateral column 53b. The first printed circuit board 3 correspondingly includes four first through holes 33. Preferably but not exclusively, the positions of the four first through holes 33 spatially correspond to the positions of the corresponding upper lateral columns 53a and the corresponding lower lateral columns 53b. When the upper magnetic cover 51 is disposed on the first side 31 of the first printed circuit board 3 and the lower magnetic cover 52 is disposed on the second side 32 of the first printed circuit board 3. Each of the upper lateral columns 53a and each of the corresponding lower lateral columns 53b pass through the corresponding first through hole 33, so as to be accommodated in the first printed circuit board 3. The upper magnetic cover 51 is connected to each of the upper lateral columns 53a. The lower magnetic cover 52 is connected to each of the lower lateral columns 53b. Each of the upper lateral columns 53a is fastened with each of the corresponding lower lateral columns 53b. In some embodiments, each of the primary windings T1 and the correspondingly coupled secondary winding T2 are disposed on the lateral column 53 including the upper lateral columns 53a and the lower lateral columns 53b. Preferably but not exclusively, the first primary winding TA1 and the first secondary winding TA2 are wound on the lateral column 531, the second primary winding TB1 and the second secondary winding TB2 are wound on the lateral column 533, the third primary winding TC1 and the third secondary winding TC2 are wound on the lateral column 532, and the fourth primary winding TD1 and the fourth secondary winding TD2 are wound on the lateral column 534. Certainly, the winding methods of the first primary winding TA1, the second primary winding TB1, the third primary winding TC1, the fourth primary winding TD1, the first secondary winding TA2, the second secondary winding TB2, the third secondary winding TC2 and the fourth secondary winding TD2 are adjustable according to the practical requirements, and are not limited thereto. Preferably but not exclusively, the DC magnetic fluxes passing through the center position which is surrounded by the first primary winding TA1, the second primary winding TB1, the third primary winding TC1 and the fourth primary winding TD1, and the center position which is surrounded by the first secondary winding TA2, the second secondary winding TB2, the third secondary winding TC2 and the fourth secondary winding TD2, can be superimposed, and the AC magnetic fluxes passing therethrough can be cancelled.

Figure 7:
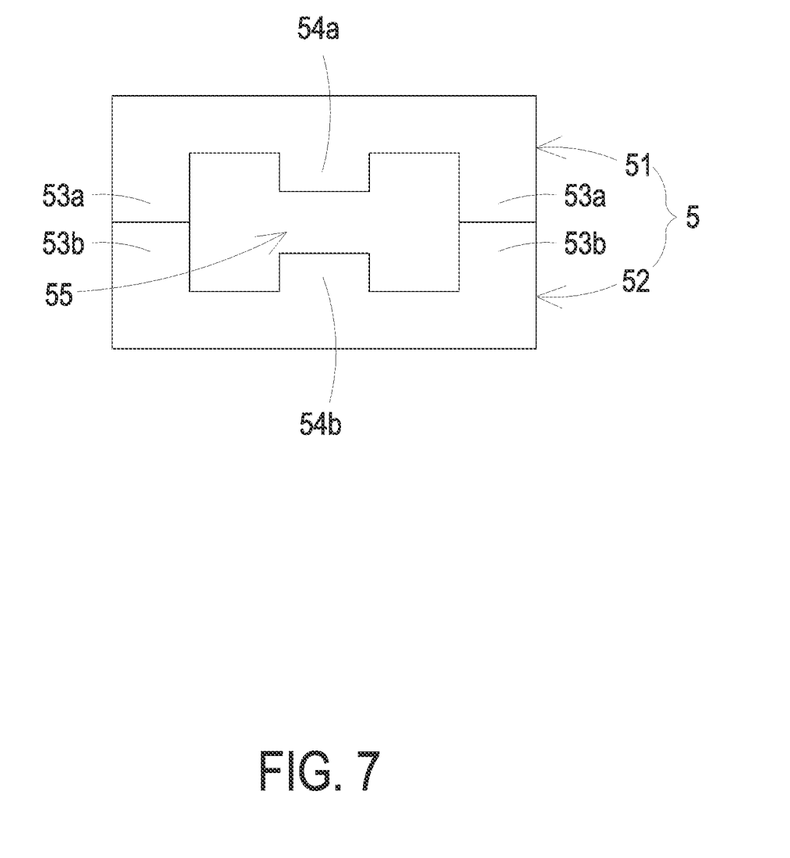
FIG. 7 is a schematic diagram of the power module with the fastened magnetic component.

Please refer to FIGS. 1 to 4 and FIG. 7. FIG. 7 is a schematic diagram of the power module shown in FIG. 1 with the fastened magnetic component. As shown in figures, in some embodiments, the middle column 54 of the magnetic component 5 further includes an upper middle column 54a and a lower middle column 54b. The upper middle column 54a is disposed among the four upper lateral columns 53a, and the lower middle column 54b is disposed among the four lower lateral columns 53b. The first printed circuit board 3 correspondingly includes a second through hole 34 passing through the first printed circuit board 3. The position of the second through hole 34 spatially corresponds to the positions of the upper middle column 54a and the lower middle column 54b. When the upper magnetic cover 51 is disposed on the first side 31 of the first printed circuit board 3 and the lower magnetic cover 52 is disposed on the second side 32 of the first printed circuit board 3, the upper middle column 54a and the lower middle column 54b pass through the corresponding second through hole 34 and are accommodated in the first printed circuit board 3. In the embodiment, an air gap 55 is disposed between the upper middle column 54a and the lower middle column 54b.

Figure 5:
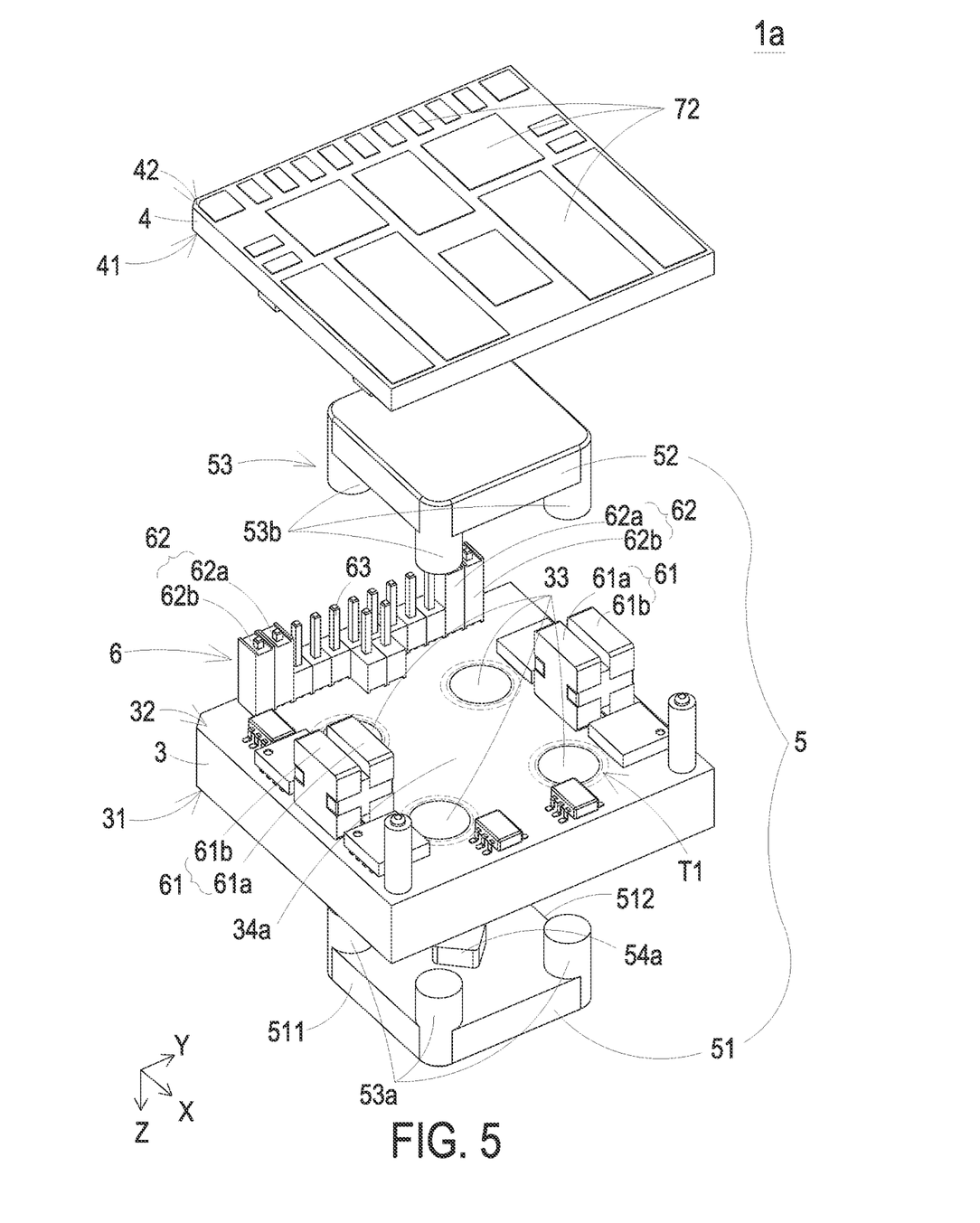
FIG. 5 is an exploded view of a power module according to another embodiment of the present disclosure.

In some embodiments, when the height of the air gap 55 of the magnetic component 5 is greater than the thickness of the first printed circuit board 3, the upper middle column 54b and the lower middle column 54b of the magnetic component 5 can be omitted, and the second through hole 34 of the first printed circuit board 3 can be omitted, too. FIG. 5 is an exploded view of the power module according to another preferred embodiment of the present disclosure. In the embodiment, the power module 1a is similar to the power module 1 shown in FIG. 1 to 4. Component parts and elements corresponding to those of the above embodiment are designated by identical numeral references, and detailed descriptions thereof are omitted. In the embodiment, the first printed circuit board 3 includes a clearance region 34a spatially corresponding to the position of the air gap 55. The clearance region 34a is misaligned to the four lateral columns 53, the four primary windings T1 and the four secondary windings T2. Namely, none of electronic components, planar windings or conductive lines used as electrical connection of the first printed circuit board 3 is disposed on the clearance region 34a. Thus, the magnetic field lines passing through the lateral column 53 further passes through the first printed circuit board 3 through the clearance region 34a. It ensures that the magnetic field lines passing through the first printed circuit board 3 has the size of the cross-sectional area corresponding to the position of the air gap 55 in the first printed circuit board 3, so as to reduce the magnetic loss of the power module 1. Furthermore, since the upper middle column 54a and the lower middle column 54b of the magnetic component 5 are omitted, the cost of manufacturing the upper middle column 54a and the lower middle column 54b is reduced, and the manufacturing process of the magnetic component 5 is simplified.

In another embodiment, the four lateral columns 53 and the middle column 54 are formed on the upper magnetic cover 51. The four lateral columns 53 and the middle column 54 pass through the first through holes 33 and the second through hole 34 of the first printed circuit board 3, respectively, so that the upper magnetic cover 51 and the lower magnetic cover 52 are fastened.

Please refer to FIGS. 1 to 4 and FIG. 6. Part of the four secondary switches D are disposed adjacent to the first side 511 of the upper magnetic cover 51. Preferably but not exclusively, the two secondary switches D shown in FIG. 1 are located on one side of the upper magnetic cover 51, and the others of the four secondary switches D are disposed adjacent to the second side 512 of the upper magnetic cover 51. The first side 511 and the second side 512 of the upper magnetic cover 51 are two opposite sides. Further, the four secondary switches D are disposed on the first side 31 of the first printed circuit board 3 and disposed symmetrically on the two opposite sides of the magnetic component 5, but are not limited thereto.

In other embodiment, two of the four secondary switches D are disposed on the first side 31 of the first printed circuit board 3, and the other two of the four secondary switches D are disposed on the second side 32 of the first printed circuit board 3. Preferably but not exclusively, the two secondary switches D disposed on the same surface are disposed symmetrically on the opposite sides of the magnetic component 5, and the positions of the two secondary switches D disposed on different sides relative to the magnetic component 5 are the same. In other embodiment, two of the four secondary switches D disposed on the first side 31 are located at a first side of the magnetic component 5, and the other two of the four secondary switches D disposed on the second side 32 are located at a second side of the magnetic component 5. The first side and the second side are two opposite sides of the upper magnetic cover 51.

In an embodiment, the power module 1 further includes an input capacitor C1 and an input capacitor C2 disposed on the second printed circuit board 4. Preferably but not exclusively, the input capacitor C1 and the input capacitor C2 are embedded in the second printed circuit board 4, or disposed on the first side 41 of the second printed circuit board 4.

In the embodiment, the connecting component 6 includes two first power connectors 61 disposed on the second side 32 of the first printed circuit board 3. When the first printed circuit board 3 is assembled to the second printed circuit board 4, the two first power connectors 61 are further connected to the first side 41 of the second printed circuit board 4. In the embodiment, each of the first power connectors 61 includes a first connector 61a and a second connector 61b. One of the two first power connectors 61 forms the output of the first phase converter circuit 21, and includes a positive output $Vo^+$ formed by the first connector 61a and a negative output $Vo^-$ formed by the second connector 61b. Another one of the two first power connectors 61 forms the output of the second phase converter circuit 22, and includes a positive output $Vo^+$ formed by the first connector 61a and a negative output $Vo^-$ formed by the second connector 61b. Furthermore, the two first power connectors 61 are disposed on the corresponding positions, which correspond to the secondary switches D disposed on the second side 32 of the first printed circuit board 3, so that the distance between each of the first power connector 61 and the corresponding secondary switch D is the shortest. Thus, the loss is reduced with shorter wiring connecting each first power connector 61 and the corresponding secondary switch D on the first printed circuit board 3. Furthermore, the negative output $Vo^-$ formed by the second connector 61b is disposed adjacent to the secondary switch D, the positive output $Vo^+$ formed by the first connector 61a is disposed adjacent to the magnetic component 5. Alternatively, both of the positive output $Vo^+$ formed by the first connector 61a and the negative output $Vo^-$ formed by the second connector 61b are disposed adjacent to the secondary switch D.

Please refer to FIGS. 1 to 4. The connecting component 6 further includes two second power connectors 62. Each of the second power connectors 62 includes a third connector 62a and a fourth connector 62b. In the embodiment, the third connector 62a and the fourth connector 62b are disposed on the second side 32 of the first printed circuit board 3. Moreover, a first end of the third connector 62a is electrically connected to the one end of the primary winding series branch, and a first end of the fourth connector 62b is electrically connected to the other end of the primary winding series branch. When the first printed circuit board 3 is assembled to the second printed circuit board 4, each of the second ends of the third connectors 62a and each of the second ends of the fourth connector 62b are further connected to the corresponding potential points of the first side 41 of the second printed circuit board 4, so that the potential points of the first printed circuit board 3 and the corresponding potential points of the second printed circuit board 4 are connected.

In the embodiment, the power module 1 further includes a plurality of first pads 71, a plurality of second pad 72 and a plurality of welding holes 73. The plurality of first pads 71 are disposed on the first side 41 of the second printed circuit board 4, and spatially correspond to the at least one connecting component 6. When the first printed circuit board 3 is assembled to the second printed circuit board 4, each of the first pads 71 and the corresponding first power connector 61 are connected to each other, so as to be electrically connected to the positive output $Vo^+$ formed by the first connector 61a of the first power connector 61 and the output $Vo^-$ formed by the second connector 61b of the first power connector 61. The plurality of welding holes 73 are disposed on the first side 41 of the second printed circuit board 4, and a part of the plurality of welding holes 73 are electrically connected to the corresponding middle point of the primary switch bridge arm disposed on the second printed circuit board 4. The other part of the plurality of welding holes 73 are electrically connected to the corresponding middle point of the capacitor bridge arm disposed on the second printed circuit board 4. When the first printed circuit board 3 is assembled to the second printed circuit board 4, the plurality of second power connectors 62 are fixed and electrically connected to a part of the plurality of welding holes 73, so as to achieve the second end of the third connector 62a fixed at the welding holes 73 and electrically connected to the corresponding middle point of the primary switch bridge arm, and the second end of the fourth connector 62b fixed at the welding holes 73 and electrically connected to the corresponding middle point of the capacitor bridge arm. The plurality of second pads 72 are disposed on the second side 42 of the second printed circuit board 4 and connected to the system board (not shown), wherein a part of the plurality of second pads 72 are electrically connected to the corresponding first pads 71 through the wiring on the second printed circuit board 4. In some embodiments, a part of the plurality of second pads 72 are the output pads for the output terminal of the power module 1 or the input pads for the input terminal of the power module 1. In that, the power module 1 transfers the output power and the input power between the power module 1 and the system board through the output pads and the input pads, respectively. In the embodiment, a part of the plurality of second pads 72 and the corresponding first pads 71 are disposed on the corresponding positions on the second side 42 and the first side 41 of the second printed circuit board 4, respectively, so that the distance between each of the second pads 72 and the corresponding first pads 71 is the shortest. Therefore, the second pads 72 and the corresponding first pads 71 are electrically connected to each other with shorter wiring on the second printed circuit board 4. The other part of the plurality of second pads 72 and the four primary switches M are disposed on the corresponding positions on the second side 42 and the first side 41 of the printed circuit board 4, respectively, so that the distance between each of the second pads 72 and the corresponding primary switch M is the shortest. With shorter wiring connecting the four primary switches M and the corresponding second pads 72 on the second printed circuit board 4, the loss of the wiring is reduced. The positions of the first pads 71 and the second pads 72 are adjustable according to the practical requirements of the system board and the structure of the power module 1, and are not limited to the positions shown in FIGS. 1 to 4. In some embodiments, the output capacitors Cout1 and Cout2 of the power module 1 are disposed on the first printed circuit board 3. One end (e.g. positive end) of the output capacitors Cout1 and Cout2 are electrically connected to the first end of the first connector 61a, and the other end (e.g. negative end) of the output capacitors Cout1 and Cout2 are electrically connected to the first end of the second connector 61b. In another embodiment, the output capacitors Cout1 and Cout2 of the power module 1 are disposed on the second printed circuit board 4. One end (e.g. positive end) of the output capacitors Cout1 and Cout2 are electrically connected to the second end of the first connector 61a, and the other end (e.g. negative end) of the output capacitors Cout1 and Cout2 are electrically connected to the second end of the second connector 61b.

Please refer to FIGS. 1 to 4. The connecting component 6 further includes a plurality of signal connectors 63 disposed on the second side 32 of the first printed circuit board 3. When the first printed circuit board 3 is assembled to the second printed circuit board 4, each of the signal connectors 63 is connected with the first side 41 of the second printed circuit board 4, so as to transfer the pulse-width controlling signals PWM1, PWM2, PWM3, PWM4 and other signals between the first printed circuit board 3 and the second printed circuit board 4. The signal connectors 63 also support between the first printed circuit board 3 and the second printed circuit board 4, so as to improve the reliability of the power module 1. The shape and the size of the plurality of first power connectors 61, the second power connector 62 and the plurality of signal connectors 63 are not limited thereto. Preferably but not exclusively, the first pads 71 are replaced by the welding holes 73, and the welding holes 73 are replaced by the pads. It is adjustable according to practical requirements.

In the embodiment, with the four primary switches M disposed on the first side 41 of the second printed circuit board 4 and the second side 42 of the second printed circuit board 4 disposed on the system board, the four primary switches M and the system board are connected through a shorter wiring on the second printed circuit board 4, so as to reduce the loss of the wiring. Moreover, with the plurality of second pads 72 on the second side 42 of the second printed circuit board 4, the heat generated by the four primary switches M are dissipated through the system board. In some embodiments, the power module 1 further includes an input filter capacitor and an output filter capacitor connected to the four primary switches M, so as to achieve the filtering effect. With shorter but wider wiring connecting the four primary switches M and the system board on the second printed circuit board 4, the input filter capacitor and the output filter capacitor are disposed on the system board, so as to be connected to the four primary switches M, and the size of the power module 1 is reduced.

In the embodiment, the shape and the size of the second printed circuit board 4 and the first printed circuit board 3 are the same. In another embodiment, the shape and the size of the second printed circuit board 4 and the first printed circuit board 3 are roughly the same. In other embodiments, the projected area of the second printed circuit board 4 on the first side 31 of the first printed circuit board 3 is greater than or equal to 80% of the area of the first side 31 of the first printed circuit board 3, which means the projected area of the second printed circuit board 4 on the first side 31 of the first printed circuit board 3 is ranged between 80% to 100% of an area of the first side 31 of the first printed circuit board 3.

Preferably but not exclusively, in another embodiment, the second printed circuit board 4 of the power module 1 is the system board. The primary switches M of the primary switch bridge arm, the capacitors of the capacitor bridge arm and the input capacitors C1, C2, C3, C4 are disposed on the system board. One end of the connecting component 6 is disposed on the second side 32 of the first printed circuit board 3, the second end of the connecting component 6 is fixed on the pads or the welding holes and electrically connected to the corresponding signals of the system board through the pads or the welding holes. In the embodiment, the second pads 72 are not disposed on the system board.

Figure 8:
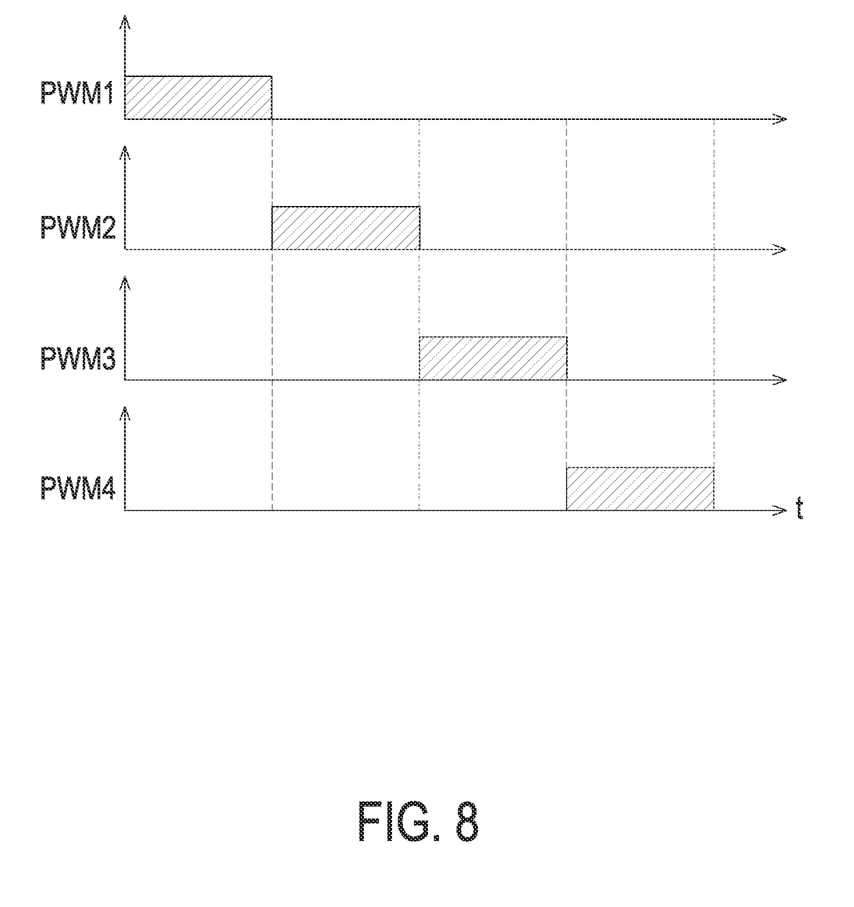
FIG. 8 is a sequence diagram of the pulse-width control signal of the controller of the power module shown in FIG. 1.

In some embodiments, the power module 1 further includes a controller 8 disposed on the first side 41 of the second printed circuit board 4. FIG. 8 is a sequence diagram of the pulse-width control signal of the controller of the power module shown in FIG. 1. As shown in FIG. 8, the controller 8 generates the four pulse-width controlling signals PWM1, PWM2, PWM3, PWM4 by sampling the output voltage and the output current of the power module 1. The pulse-width controlling signals PWM1, PWM3 are used to drive the first phase converter circuit 21, and the phase difference between the two signals is 180 degrees. The pulse-width controlling signals PWM2, PWM4 are used to drive the second phase converter circuit 22, and the phase difference between the two signals is also 180 degrees. Furthermore, the phase differences between the two pulse-width controlling signals PWM1, PWM3 in the first phase converter circuit 21 and the two pulse-width controlling signals PWM2, PWM4 in the second phase converter circuit 22 are (360/4)=90 degrees, pairwisely. For example, the pulse-width controlling signal PWM1 is utilized to control the first primary switch M1 of the first phase converter circuit 21, the pulse-width controlling signal PWM3 is utilized to control the second primary switch M2 of the first phase converter circuit 21, the pulse-width controlling signal PWM2 is utilized to control the third primary switch M3 of the second phase converter circuit 22, and the pulse-width controlling signal PWM4 is utilized to control the fourth primary switch M4 of the second phase converter circuit 22. The phase difference between the pulse-width controlling signal PWM1 and the pulse-width controlling signal PWM3 is 180 degrees, the phase difference between the pulse-width controlling signal PWM2 and the pulse-width controlling signal PWM4 is 180 degrees, the phase difference between the pulse-width controlling signal PWM1 and pulse-width controlling signal PWM2 is 90 degrees, and the phase difference pulse-width controlling signal PWM3 and the pulse-width controlling signal PWM4 between is 90 degrees. Therefore, the pulse-width controlling signals PWM1 and PWM3 are utilized to control the phase difference of the control sequence between the first primary switch M1 and the second primary switch M2 at 180 degrees by the controller 8, the pulse-width controlling signals PWM2 and PWM4 are utilized to control the phase difference of the control sequence between the third primary switch M3 and the fourth primary switch M4 at 180 degrees by the controller 8, the pulse-width controlling signals PWM1 and PWM2 are utilized to control the phase difference of the control sequence between the first primary switch M1 and the third primary switch M3 at 90 degrees by the controller 8, the pulse-width controlling signals PWM1 and PWM4 are utilized to control the phase difference of the control sequence between the first primary switch M1 and the fourth primary switch M4 at 90 degrees by the controller 8, the pulse-width controlling signals PWM3 and PWM2 are utilized to control the phase difference of the control sequence between the second primary switch M2 and the third primary switch M3 at 90 degrees by the controller 8, and the pulse-width controlling signals PWM3 and PWM4 are utilized to control the phase difference of the control sequence between the second primary switch M2 and the fourth primary switch M4 at 90 degrees by the controller 8. In the embodiment, the duty ratios of the first primary switch M1, the second primary switch M2, the third primary switch M3 and the fourth primary switch M4 are less than 50%. As described above, in the embodiment, the phase difference between the primary switch of a phase converter circuit and the corresponding primary switch of another phase converter circuit are controlled at 90 degrees by the controller 8 of the power module 1, so that the output current ripple is reduced, and the size of the output filter is also reduced when the output filter is disposed on the system board.

In another embodiment, the phase difference between adjacent two of the four pulse-width controlling signals PWM1, PWM2, PWM3, PWM4 is any value between 60 degrees and 120 degrees [60, 120]. The output current ripple is reduced, and the size of the output filter is also reduced when the output filter is disposed on the system board.

In some embodiments, the power module 1 is formed by connecting N-phase converter circuits in parallel. The phase difference between each two of the converter circuits is any value between (360/2N)−30 degrees and (360/2N)+30 degrees [(360/2N)−30, (360/2N)+30], wherein N is an integer greater than 0. Preferably but not exclusively, the phase difference is (360/2N) degrees. The layout structure of power module 1 is referred to FIGS. 1 to 4. The magnetic component 5 includes 2N lateral columns 53. The directions of the DC magnetic fluxes of the 2N lateral columns 53 are the same, and the phase difference between the AC magnetic fluxes is any value between (360/2N)−30 degrees and (360/2N+30) degrees. The numbers of the first power connectors 61 and the second power connectors 62 are N, but is not limited thereto and adjustable according to actual requirements. The configuration of each power connector is referred to FIGS. 1 to 4, and is not redundantly described herein.

Figure 9:
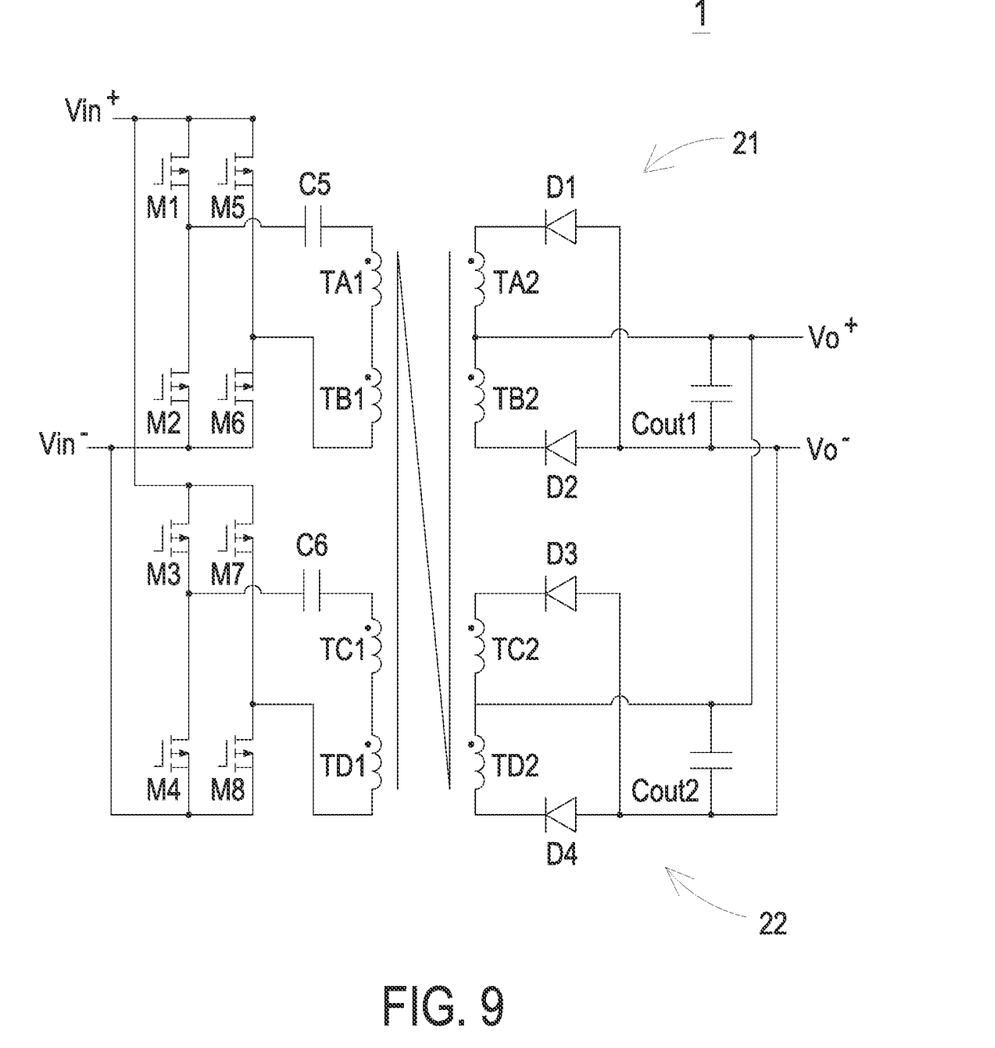
FIG. 9 is an equivalent circuit diagram of the power module according to another embodiment of the present disclosure shown in FIG. 1.

FIG. 9 is another equivalent circuit diagram of the power module according to another embodiment of the present disclosure shown in FIG. 1. As shown in FIG. 9, the primary side of the first phase converter circuit 21 further includes a fifth primary switch M5, a sixth primary switch M6 and a blocking capacitor C5 compared with FIG. 5. As shown in FIG. 9, another first primary switch bridge arm is formed by electrically connecting the fifth primary switch M5 and the sixth primary switch M6 in series. A second end of the fifth primary switch M5 and a first end of the sixth primary switch M6 are electrically connected and form a middle point of the another first primary switch bridge arm. The first end of the first primary switch M1 and the first end of the fifth primary switch M5 are electrically connected. The second end of the second primary switch M2 and the second end of the sixth primary switch M6 are electrically connected. The first primary winding series branch further includes the blocking capacitor C5, and the other end of the first primary winding series branch is electrically connected to the middle point of the another first primary switch bridge arm. Similarly, the primary side of the second phase converter circuit 22 further includes a seventh primary switch M7, an eighth primary switch M8 and a blocking capacitor C6. Another second primary switch bridge arm is formed by electrically connecting the seventh primary switch M7 and the eighth primary switch M8 in series. A second end of the seventh primary switch M7 and a first end of the eighth primary switch M8 are electrically connected and form a middle point of the another second primary switch bridge arm. The first end of the third primary switch M3 and the first end of the seventh primary switch M7 are electrically connected. The second end of the fourth primary switch M4 and the second end of the eighth primary switch M8 are electrically connected. The second primary winding series branch further includes the blocking capacitor C6, and the other end of the second primary winding series branch is electrically connected to the middle point of the another second primary switch bridge arm.

In the embodiment, the disposed positions of the components in the first phase converter circuit 21 and the second phase converter circuit 22 are similar to those shown in FIGS. 1 to 4. The same is that the two printed circuit boards are disposed adjacently, the secondary switches D and the magnetic component 5 are disposed on the first printed circuit board 3, the primary switches M are disposed on the second printed circuit board 4, and the two printed circuit boards are electrically connected and fixed with the connecting component 6. The difference is that a part of the plurality of the welding holes 73 disposed on the first side 41 of the second printed circuit board 4 and the middle point of the corresponding primary switch bridge arm disposed on the second printed circuit board 4 are electrically connected, and the other part of the plurality of the welding holes 73 and the middle point of the another corresponding primary switch bridge arm disposed on the second printed circuit board 4 are electrically connected. Other same parts are not redundantly described herein. In some embodiments, the first phase converter circuit 21 and the second phase converter circuit 22 are formed by dual flyback circuits, adjustable duty ratio converter circuits or fixed ratio fixed ratio conversion circuits, but are not limited thereto. The power module 1 with these converter circuits is implemented by the structure of two printed circuit boards disposed adjacently described above. The secondary switches D and the magnetic component 5 are disposed on the first printed circuit board 3, the primary switches M are disposed on the second printed circuit board 4, and the two printed circuit boards are electrically connected and fixed with the connecting component 6. Therefore, the size of the power module 1 is reduced, and the power density is increased.

In another embodiment, the converter circuit of the power module 1 is a single phase converter circuit. For example, full bridge converter, half bridge converter, forward converter circuit, flyback converter circuit, and so on. Preferably but not exclusively, the corresponding magnetic core components are traditional U core or E core. The above options may be applied in the power module architecture of the present disclosure, which includes two printed circuit boards disposed adjacently. The secondary switches D and the magnetic component 5 are disposed on the first printed circuit board 3, the primary switches M are disposed on the second printed circuit board 4, and the two printed circuit boards are electrically connected and fixed with the connecting component 6. Therefore, the size of the power module 1 is reduced, and the power density is increased.

Similarly, when the multiple phase converter circuit is utilized to increase the output power of the power module 1, the connection modes of the primary side and the secondary side are implemented as the foregoing embodiment. The connection mode of the primary side is in parallel and the connection mode of the secondary side in parallel. In an embodiment, the connection mode of the primary side is in parallel and the connection mode of the secondary side in series. Alternatively, the primary side is connected to the secondary side in series, and the connection mode of the secondary side is in series or in parallel. As previous embodiment, the magnetic integration technology is utilized by the transformer of the multiple phase converter circuit, so as to reduce magnetic loss and the size of the magnetic component 5, which can also be achieved by utilizing independent transformers. The structure of two printed circuit boards disposed adjacently are utilized on the above embodiment. In that, the secondary switches D and the magnetic component 5 are disposed on the first printed circuit board 3, the primary switches M are disposed on the second printed circuit board 4, and the two printed circuit boards are electrically connected and fixed with the connecting component 6. Therefore, the size of the power module 1 is reduced, and the power density is increased.

As stated above, the two phase converter circuit of the power module of the present disclosure shares a single magnetic component, so that the cost of the power module of the present disclosure is lower. Furthermore, in the power module of present disclosure, with single magnetic component, the primary winding and the secondary winding corresponding to the first phase converter circuit are coupled with each other, and the primary winding and the secondary winding corresponding to the second phase converter circuit are coupled with each other, simultaneously. With the magnetic integration technology, the four primary windings and the four secondary windings form the two magnetic integrated transformers, respectively. Therefore, the size of the transformer and the occupied space on the first printed circuit board are reduced, and the power density is increased with more components disposed on the first printed circuit board. By disposing the primary switches on the second printed circuit board, more space is provided on the first printed circuit board to dispose the primary windings and the secondary windings and the trace width for the primary windings and the secondary windings are widen, so that the loss in the transformer is decreased and the power density of the power module is increased.

What is claimed is:

1. A power module, comprising:
   a first printed circuit board, comprising a first side and a second side, wherein a secondary side switch set is disposed on the first side or the second side of the first printed circuit board, and a winding is disposed on the first printed circuit board;
   a second printed circuit board, comprising a first side and a second side, wherein the first side of the second printed circuit board is adjacent to the second side of the first printed circuit board, and a primary side switch set is disposed on the first side of the second printed circuit board;
   a magnetic component, comprising an upper magnetic cover, a lower magnetic cover and a lateral column, wherein the lateral column is located between the upper magnetic cover and the lower magnetic cover, the lower magnetic cover is disposed between the first printed circuit board and the second printed circuit board, the upper magnetic cover is disposed on the first side of the first printed circuit board, and the lateral column passes through the first printed circuit board and is fastened with the upper magnetic cover and the lower magnetic cover, wherein the magnetic component and the winding collaboratively form a transformer; and
   at least one connecting component, disposed between the first printed circuit board and the second printed circuit board to connect a potential point of the first printed circuit board and a corresponding potential point of the second printed circuit board.

2. The power module according to claim 1, wherein the second printed circuit board comprises a plurality of first pads disposed on the first side of the second printed circuit board and spatially corresponding to the at least one connecting component.

3. The power module according to claim 2, wherein the second printed circuit board comprises a plurality of second pads disposed on the second side of the second printed circuit board and connected to a system board, wherein the plurality of second pads spatially correspond to the plurality of first pads.

4. The power module according to claim 1, wherein the second printed circuit board comprises a plurality of second pads disposed on the second side of the second printed circuit board and connected to a system board, wherein the plurality of second pads spatially corresponds to the primary side switch set or the at least one connecting component on the first side of the second printed circuit board.

5. The power module according to claim 1, wherein the secondary side switch set comprises at least four secondary switches, two of the at least four secondary switches are adjacent to a first side of the magnetic component, the other two of the at least four secondary switches are adjacent to a second side of the magnetic component, wherein the first side and the second side are the two opposite sides of the upper magnetic cover.

6. The power module according to claim 1, wherein the winding comprises four primary windings and four secondary windings disposed on the first printed circuit board.

7. The power module according to claim 6, wherein the four primary windings are disposed adjacent to the second side of the first printed circuit board, and the four secondary windings are disposed adjacent to the first side of the first printed circuit board.

8. The power module according to claim 6, wherein the magnetic component comprises four lateral columns, the first printed circuit board comprises a first through hole, and the lateral column passes through the first through hole, wherein each of the lateral columns is wound by the corresponding primary winding and the corresponding secondary winding, so as to form the transformer.

9. The power module according to claim 8, wherein the magnetic component further comprises a center column passing through a second through hole of the first printed circuit board, and the upper magnetic cover and the lower magnetic cover are fastened with each other.

10. The power module according to claim 9, wherein the center column comprises an upper center column disposed on the upper magnetic cover and a lower center column disposed on the lower magnetic cover, wherein an air gap is disposed between the upper center column and the lower center column.

11. The power module according to claim 8, wherein the magnetic component further comprises a clearance region misaligned to the four lateral columns, the four primary windings and the four secondary windings.

12. The power module according to claim 1, wherein the at least one connecting component further comprises at least two first power connectors, each of the first power connectors comprises a first connector and a second connector disposed between the second side of the first printed circuit board and the first side of the second printed circuit board, wherein the at least two first power connectors spatially correspond to the secondary side switch set.

13. The power module according to claim 12, wherein the second printed circuit board comprises a plurality of first pads disposed on the first side of the second printed circuit board, wherein the first connector and the second connector are electrically connected and fixed to the plurality of first pads, respectively.

14. The power module according to claim 1, wherein the at least one connecting component further comprises at least two second power connectors disposed between the second side of the first printed circuit board and the first side of the second printed circuit board.

15. The power module according to claim 14, wherein each of the second power connectors comprises a third connector and a fourth connector electrically connected to two opposite end of the winding, respectively.

16. The power module according to claim 1, further comprising an output capacitor disposed on the first printed circuit board or the second printed circuit board, and electrically connected to the at least one connecting component.

17. The power module according to claim 1, wherein the at least one connecting component further comprises a plurality of signal connectors disposed between the second side of the first printed circuit board and the first side of the second printed circuit board.

18. The power module according to claim 1, further comprising at least one input capacitor disposed on the second printed circuit board.

19. The power module according to claim 1, wherein a projected area of the second printed circuit board on the first side of the first printed circuit board is ranged between 80% and 100% of an area of the first side of the first printed circuit board.

20. The power module according to claim 1, further comprising a controller disposed on the first side of the second printed circuit board.

* * * * *